US006919530B2

(12) United States Patent
Borgeson et al.

(10) Patent No.: US 6,919,530 B2
(45) Date of Patent: Jul. 19, 2005

(54) METHOD AND APPARATUS FOR LASER SCRIBING GLASS SHEET SUBSTRATE COATINGS

(75) Inventors: Frank A. Borgeson, Scottsdale, AZ (US); Joseph J. Hanak, Ames, IA (US); Ricky S. Harju, deceased, late of Luckey, OH (US); by Karen M. Harju, legal representative, Luckey, OH (US); Norman L. Helman, Scottsdale, AZ (US); Kenneth R. Hecht, Gilbert, AZ (US)

(73) Assignee: First Solar LLC, Perrysburg, OH (US)

( * ) Notice: Subject to any disclaimer, the term of this patent is extended or adjusted under 35 U.S.C. 154(b) by 252 days.

(21) Appl. No.: 10/425,704

(22) Filed: Apr. 30, 2003

(65) Prior Publication Data

US 2003/0209527 A1 Nov. 13, 2003

Related U.S. Application Data

(63) Continuation of application No. 09/928,203, filed on Aug. 10, 2001, now Pat. No. 6,559,411.

(51) Int. Cl.⁷ ............................................. B23K 26/00
(52) U.S. Cl. ............................. 219/121.68; 219/121.69
(58) Field of Search .................... 219/121.68, 121.69, 219/121.67, 121.6, 121.85, 121.82

(56) References Cited

U.S. PATENT DOCUMENTS

| 4,292,092 A | | 9/1981 | Hanak |
| 4,535,218 A | | 8/1985 | Krause et al. |
| 4,568,409 A | * | 2/1986 | Caplan ..................... 438/690 |
| 4,603,470 A | | 8/1986 | Yamazaki |
| 4,645,547 A | | 2/1987 | Krause et al. |
| 4,689,874 A | | 9/1987 | Nishiura |
| 4,854,974 A | | 8/1989 | Carlson et al. |
| 4,892,592 A | | 1/1990 | Dickson et al. |
| 5,248,349 A | | 9/1993 | Foote et al. |
| 5,296,674 A | * | 3/1994 | Praschek et al. ........ 219/121.69 |
| 5,372,646 A | | 12/1994 | Foote et al. |
| 5,470,397 A | | 11/1995 | Foote et al. |
| 5,536,333 A | | 7/1996 | Foote et al. |
| 5,593,901 A | | 1/1997 | Oswald et al. |
| 5,658,474 A | | 8/1997 | Geerke |
| 5,934,163 A | | 8/1999 | Saunders et al. |
| 5,956,572 A | | 9/1999 | Kidoguchi et al. |
| 6,037,241 A | | 3/2000 | Powell et al. |
| 6,300,593 B1 | | 10/2001 | Powell |
| 6,329,229 B1 | | 12/2001 | Yamazaki et al. |
| 6,420,675 B1 | | 7/2002 | Lizotte et al. |

OTHER PUBLICATIONS

Compaan, A. D., et al., "Laser scribing of polycrystalline thin films", Optics and Lasers in Engineering, 34, pp. 15–45, (2000).

* cited by examiner

Primary Examiner—M. Alexandra Elve
(74) Attorney, Agent, or Firm—Steptoe & Johnson LLP

(57) ABSTRACT

A method and apparatus (42) for laser scribing coatings on glass sheet substrates by conveying the substrate adjacent a laser source (83) that provides a pulsed laser beam (84) with a wavelength at a near-infrared fundamental frequency and having a frequency in the range of 50 to 100 kilohertz and a pulse duration in the range of 8 to 70 nanoseconds, and by reflecting the beam by an XYZ galvanometer controlled mirror system (90) toward an uncoated surface of the substrate for passage therethrough to the coating on the other surface to provide overlapping ablations through the coating and scribing at a speed of at least 1000 millimeters per second.

40 Claims, 6 Drawing Sheets

METHOD AND APPARATUS FOR LASER SCRIBING GLASS SHEET SUBSTRATE COATINGS

CLAIM OF PRIORITY

This application is a continuation of U.S. patent application Ser. No. 09/928,203 filed on Aug. 10, 2001, now U.S. Pat. No. 6,559,411 the entire contents of which is hereby incorporated by reference.

FEDERALLY SPONSORED RESEARCH OR DEVELOPMENT

This invention was made with Government support under NREL Subcontract No. ZAX-8-17647-06, Prime Contract No. DE-AC36-98GO10337 awarded by the Department of Energy. The government has certain rights in this invention.

TECHNICAL FIELD

This invention relates to a method and an apparatus for laser scribing of coated layers on glass sheet substrates.

BACKGROUND

Laser scribing of coated layers on glass sheet substrates has been done for many years as disclosed by U.S. Pat. No. 4,292,092 Hanak. To a large extent, the laser scribing is performed by a laser beam that is directed from the coated side of the substrate; however, the scribing has also been performed by directing the laser beam through the glass sheet substrate to the coated layers to be scribed such as disclosed by U.S. Pat. No. 4,568,409 Caplan, U.S. Pat. No. 4,854,974 Carlson et al., U.S. Pat. No. 4,892,592 Dickson et al., U.S. Pat. No. 5,296,674 Praschek et al., and Oswald et al.

Traditional laser processing systems are of two types. One type includes a fixed laser head mounted over a movable XY table (two axis) on which the coated glass sheet is supported for the scribing, while the other type includes a single axis movable laser scanning head mounted over a single axis movable table. The major drawback of the first type is the speed limitation of large XY tables, which is generally in the range of about 300 to 500 millimeters per second. Thus, in order to achieve commercially practical output, it is necessary to use multiple lasers or split beams to feed several laser nozzles. In addition to being expensive, such systems require maintaining optical alignment which is difficult and also require that the power to each nozzle be independently controlled. In addition, it is imperative to have real time spacing and adjustment between nozzles to facilitate the spacing between scribes. The other system also has the same problems since it is difficult to move the laser head faster than about 700 to 800 millimeters per second.

Other laser scribing patents noted during an investigation conducted in connection with the present application include United States patents Yamazaki U.S. Pat. No. 4,603,470, Nishiura U.S. Pat. No. 4,689,874, and Kidoguchi et al U.S. Pat. No. 5,956,572.

SUMMARY

An object of the present invention is to provide an improved method for laser scribing glass sheet substrate coatings at a relatively high speed so as to thereby provide a cost effective product.

In carrying out the above object, the method for laser scribing is performed with a glass sheet substrate having oppositely facing surfaces one of which is uncoated and the other of which is coated. The coated substrate is conveyed along a direction of conveyance adjacent a laser source that provides a pulsed laser beam with a wavelength at a near-infrared fundamental frequency and having a pulse frequency in the range of 50 to 100 kilohertz and a pulse duration in the range of 8 to 70 nanoseconds. The pulsed laser beam is reflected from the laser source by an XYZ galvanometer controlled mirror system toward the uncoated surface of the glass sheet substrate for passage therethrough to the coating on the other surface to provide overlapping ablations through the coating and scribing thereof at a speed of at least 1000 millimeters per second.

The glass sheet substrate is conveyed in a vertical orientation and is positioned laterally with respect to the direction of conveyance by gas pressure and vacuum positioners located upstream and downstream along the direction of conveyance from the location at which the pulsed laser beam passes through the substrate such that the positioners control the planarity of the substrate. The gas pressure and vacuum positioners position the glass sheet substrate at its uncoated surface so there is no degradation of the coated surface.

Laser detectors detect the exact position of the coated substrate so the scribing laser beam can be properly focused.

In one practice of the method, the conveyance of the coated glass sheet substrate is provided by indexing thereof with the substrate being held stationary during the laser scribing.

In another practice of the method, the laser scribing is performed as the coated glass sheet substrate is conveyed.

In performing the laser scribing method, the coated glass sheet substrate is disclosed as having a plurality of different coated layers and a plurality of the laser scribes are made at different power levels so the scribes extend through different layers. More specifically, in the most rapid performance of the laser scribing method, a plurality of laser sources and associated XYZ galvanometer controlled mirror systems respectively provide the pulsed laser scribing of the different scribes at different power levels, each with a wavelength at a near-infrared fundamental frequency and with pulse frequencies in the range of 50 to 100 kilohertz and pulse durations in the range of 8 to 70 nanoseconds and at scribing speeds of at least 1000 millimeters per second.

Another object of the present invention is to provide improved apparatus for laser scribing a coating on a glass sheet substrate.

In carrying out the immediately preceding object, the apparatus of the invention includes a conveyor for conveying a glass sheet substrate along a direction of conveyance with the substrate having oppositely facing surfaces one of which is uncoated and the other of which has a coating. A laser source provides a pulsed laser beam with a wavelength at a near-infrared fundamental frequency and having a pulse frequency in the range of 50 to 100 kilohertz and a pulse duration in the range of 8 to 70 nanoseconds. An XYZ galvanometer controlled mirror system reflects the pulsed laser beam from the laser source toward the uncoated surface of the glass sheet substrate for passage therethrough to the coating on the other surface to provide overlapping ablations through the coating and scribing thereof at a speed of at least 1000 millimeters per second.

The apparatus supports the substrate in a vertical orientation and includes gas pressure and vacuum positioners located upstream and downstream along the direction of conveyance from the location at which the pulsed laser beam passes through the substrate such that the positioners control the planarity of the substrate during the laser scribing.

The apparatus includes laser detectors that detect the exact position of the coated substrate so the scribing laser beam can be properly focused.

The apparatus disclosed includes a plurality of the pulsed laser sources that operate at different power levels, each with a wavelength at a near-infrared fundamental frequency and with a pulse frequency in the range of 50 to 100 kilohertz and a pulse duration in the range of 8 to 70 nanoseconds, and a plurality of XYZ galvanometer controlled laser mirror systems of the apparatus respectively reflect the pulsed laser beams from the laser sources to provide scribing at speeds of at least 1000 millimeters per second.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
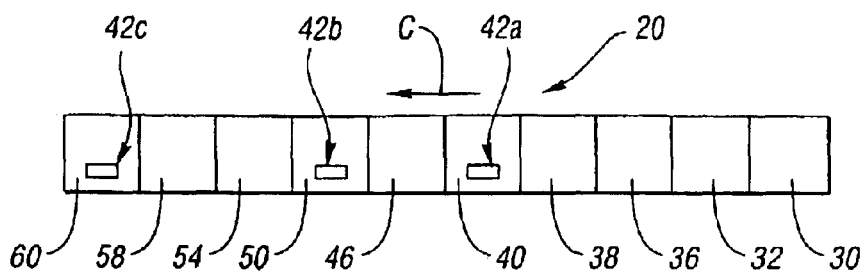
FIG. 1 is a schematic view of various stations of a photovoltaic panel manufacturing system that includes laser scribing apparatus constructed in accordance with the present invention to perform the method of the invention.
Figure 2:
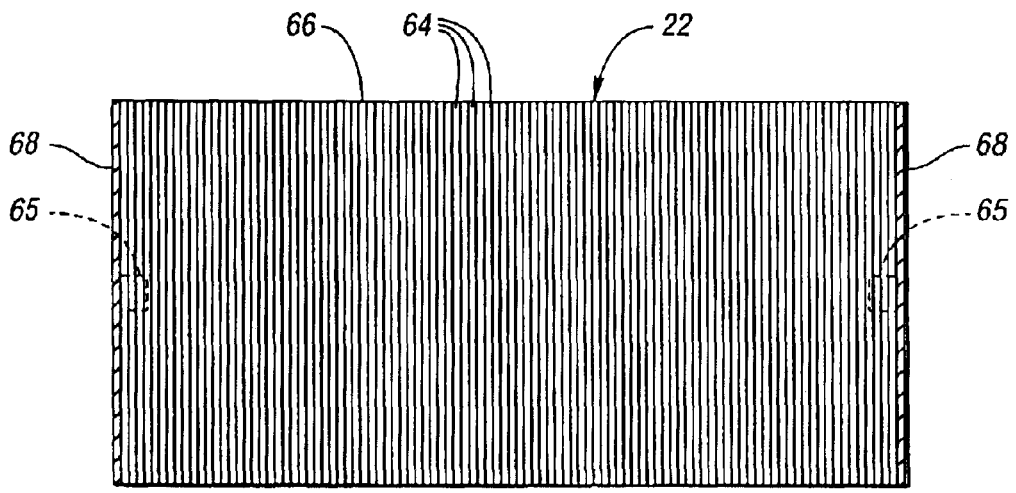
FIG. 2 is a plan view of a photovoltaic panel that has been scribed to provide separate cells.
Figure 3:
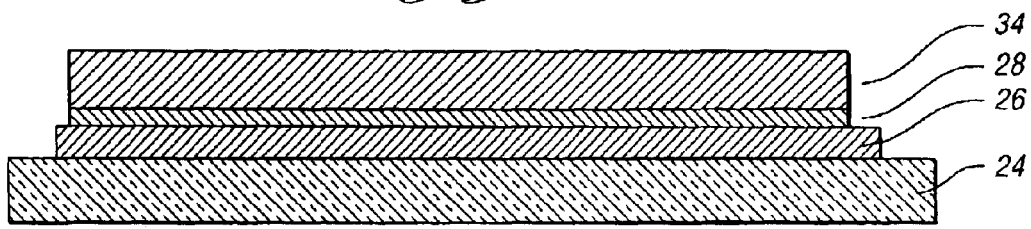
FIG. 3 is a sectional view taken through a glass sheet substrate which has coated layers thereon to be scribed to provide the photovoltaic panel.
Figure 4:
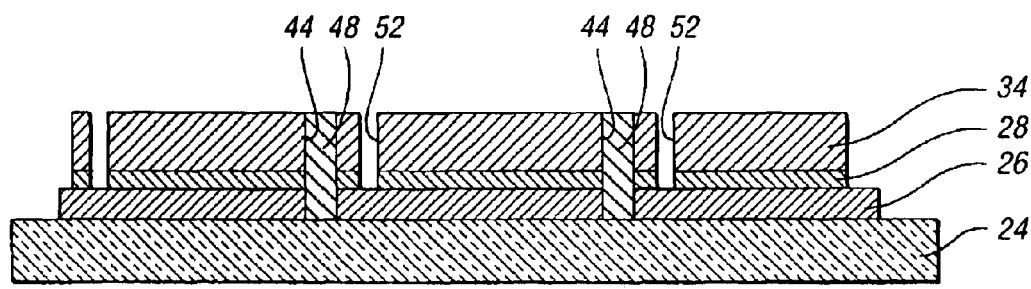
FIG. 4 is a sectional view similar to FIG. 3 illustrating the panel after first and second scribes have been made.
Figure 5:
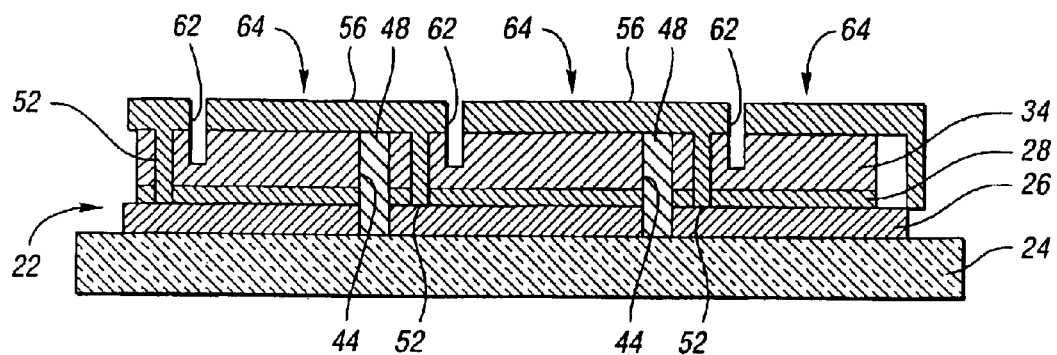
FIG. 5 is a sectional view similar to FIG. 4 illustrating the panel at a later stage after a third scribe has been made.

With reference to FIGS. 1, 2 and 3 of the drawings, a system 20 includes certain illustrated stations utilized in manufacturing of a photovoltaic panel 22. The panel 22 is manufactured using a glass sheet substrate 24 which is shown in FIG. 3 as having one surface coated with a tin oxide layer 26. After washing and cleaning of the tin oxide coated glass substrate 24, a cadmium sulfide layer 28 about 3000 angstroms thick is deposited at a first station 30. The manufacturing proceeds as the glass sheet substrate is conveyed along a direction of conveyance illustrated by arrow C to a second station 32 where a cadmium telluride layer 34 about 3 microns thick is deposited prior to movement through treating stations 36 and 38. After subsequent conveyance of the substrate to a first scribing station 40, pulsed laser scribing apparatus 42$_a$ provides scribing of a first set of scribes 44, in a manner performed in accordance with the present invention as is hereinafter more fully described, through the tin oxide layer 26, the cadmium sulfide layer 28 and the cadmium telluride layer 34. After scribing the first set of scribes 44, the substrate is then conveyed to a station 46 where the first set of scribes 44 are filled with a dielectric material 48, whereupon the substrate is conveyed to a second scribing station 50 where pulsed laser scribing apparatus 42$_b$ constructed in accordance with the invention operates at a lower power level than the first scribing station to provide scribing of a second set of scribes 52 through the cadmium sulfide layer 28 and the cadmium telluride layer 34 without scribing the tin oxide layer 26. The substrate is then conveyed to a coating station 54 where an electrically conductive back contact layer 56 (FIG. 5) is applied prior to movement to a treatment station 58. The substrate is then conveyed to a third scribing station 60 where scribing apparatus 42$_c$ constructed in accordance with this invention operates at a lower power level than the second scribing station to provide a third set of scribes 62 through the back contact layer 56 in order to provide separate cells 64 that are electrically connected to each other in series. Electrical connectors 65 shown in FIG. 2 provide electrical connection of the panel for use.

The deposition of the cadmium sulfide at station 30 illustrated in FIG. 1 and the deposition of the cadmium telluride at station 32 may be performed in accordance with the disclosures of U.S. Pat. No. 5,248,349 Foote et al., U.S. Pat. No. 5,372,646 Foote et al., U.S. Pat. No. 5,470,397 Foote et al., U.S. Pat. No. 5,536,333 Foote et al., U.S. Pat. No. 5,934,163 Powell et al., and U.S. Pat. No. 6,037,241 Powell entire disclosures of which are hereby incorporated by reference.

The photovoltaic panel 22 shown in FIG. 2 has an elongated shape with a width of about 60 centimeters (600 millimeters) between its opposite sides 66 and a length of about 120 centimeters between its opposite ends 68. Furthermore, the scribing described above provides 115 of the cells 64 such that the available space for each cell including the associated scribes is just slightly more than one centimeter. Each set of scribes for providing the 115 cells of the panel thus has a total length of about 69,000 millimeters. In order to perform economical manufacturing where the panels can be made in about a minute or so, the laser apparatus must have a scribing speed of about 1000 millimeters per second or greater. In actuality, the scribing apparatus of the invention as is hereinafter more fully described has a scribe speed of 2000 to 3000 millimeters per second to allow for transfer time between stations. While it is possible to utilize a single laser apparatus to do each set of scribes, provision of the laser scribing apparatus 42$_a$, 42$_b$, and 42$_c$ at each of the three scribing stations as illustrated in FIG. 1 provides a higher rate of operation and a consequently more cost efficient product.

Figure 6:
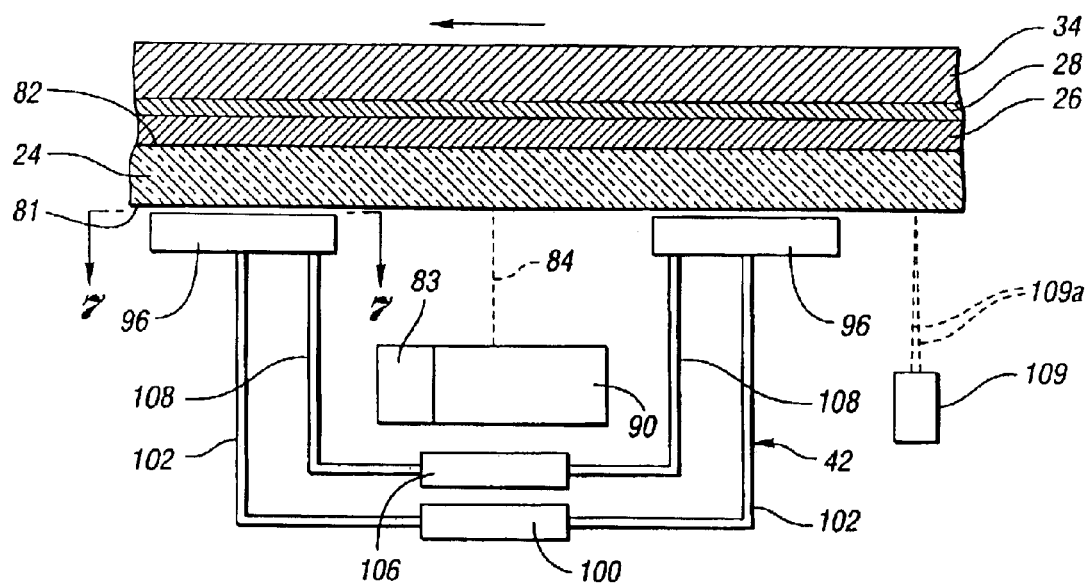
FIG. 6 is a schematic view that illustrates the manner in which the scribing is performed.

The method for laser scribing coated glass sheet substrates will be described in connection with the laser scribing apparatus 42 in an integrated manner to facilitate an understanding of all aspects of the invention. This laser scribing apparatus 42 is illustrated in FIGS. 6–10 and as specifically illustrated in FIG. 8 includes a right loading end 70, a left unloading end 72, and a central laser scribing module 74. The coated glass sheet substrate to be scribed is conveyed in a vertically extending orientation toward the left from the loading end 70 to the laser scribing module 74 for the laser scribing and is subsequently conveyed toward the left to the unloading end 72 in preparation for delivery to the next station. The conveyance from the loading end 70 is provided on a loading cart 76 and the glass sheet is received by a laser scribing conveyor 78 best shown in FIG. 10 for accurately controlled conveyance during the laser scribing operation. After the laser scribing as is hereinafter more fully described, the scribed glass sheet substrate is delivered from the laser scribing conveyor 78 to an unloading cart 80 of the unloading station 72 shown in FIG. 8. The conveyor 78 conveys the glass sheet substrate 24 which as illustrated in FIG. 6 has an uncoated surface 81 and a coated surface 82 on which the tin oxide, cadmium sulfide and cadmium telluride layers are located such that this would correspond to scribing at the first scribing station 40 illustrated in FIG. 1 prior to application of the back contact layer previously described. The scribing is performed by directing a laser beam through the glass sheet substrate 24 from its uncoated surface 81 to its coated surface 82 and through to the different layers for the scribing, with the layers scribed being controlled by the power level of the laser for each of the scribes.

Figure 9:
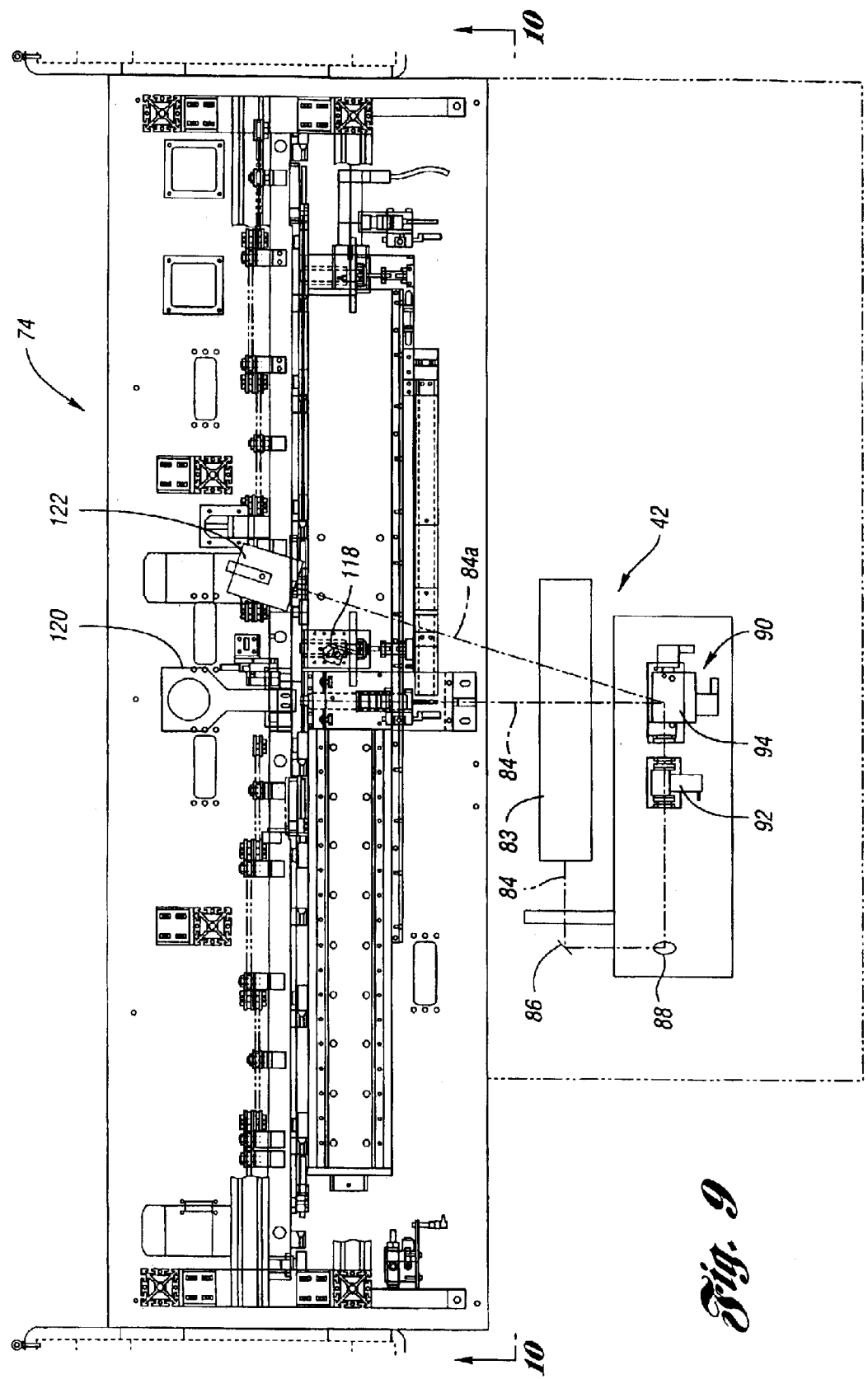
FIG. 9 is a top plan view taken at an enlarged scale along the direction of line 9—9 in FIG. 8 to illustrate the laser scribing module.

As best illustrated in FIG. 9, the laser scribing apparatus 42 includes a laser source 83 that provides the pulsed laser beam 84 with a wavelength at a near-infrared fundamental frequency and having a pulse frequency in the range of 50 to 100 kilohertz and a pulse duration in the range of 8 to 70 nanoseconds. The specific laser source 83 utilized is a diode-pumped, Q-switched, neodymium-doped, yttrium vanadate laser source providing a pulsed laser beam with a wavelength at its near-infrared fundamental frequency of 1064 nanometers and operating at a pulse frequency in the range of 50 to 100 kilohertz with the pulse duration in the range of 8 to 70 nanoseconds. The pulsed laser beam is reflected by mirrors 86 and 88 to an XYZ galvanometer controlled mirror system collectively indicated by 90 that directs the laser beam to perform the scribing. More specifically, the XYZ galvanometer controlled mirror system 90 includes a galvanometer controlled focuser 92 that moves a lens horizontally to control the focal length of the beam in the Z direction and a galvanometer controlled dual mirror assembly 94 that directs the beam in the XY directions so as to thereby collectively provide XYZ control.

Figure 11:
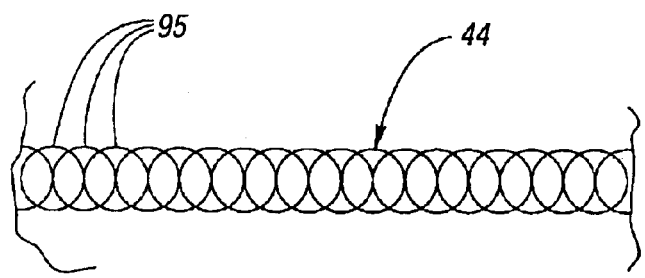
FIG. 11 is a schematic view illustrating the manner in which overlapping ablations through a coating on the substrate perform laser scribing.

By laser scribing of the scribes from the uncoated surface 81 of the glass sheet substrate 24 shown in FIG. 6, there is no gas plume formed by the ablations that provide the scribing such that the plumes cannot prevent the next laser pulses from passing through the coatings to provide each next ablation. More specifically, the scribing as shown in FIG. 11 is performed with the ablations 95 overlapping each other. An overlap of 50% provides a generally uniform scribe width and a fast scribe speed. The ablations 95 thus provide a scribe such as the first scribe 44 illustrated in FIG. 11, and the second and third scribes are also provided in the same way.

Figure 7:
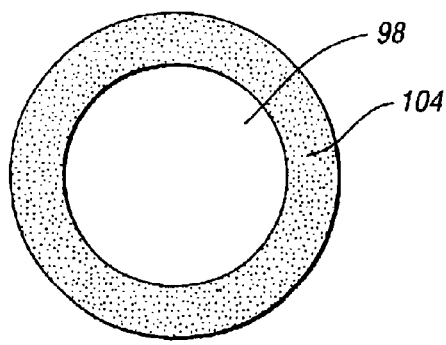
FIG. 7 is a view taken in the direction of line 7—7 in FIG. 6 to illustrate the construction of positioners utilized to locate the glass sheet substrate during the scribing.
Figure 10:
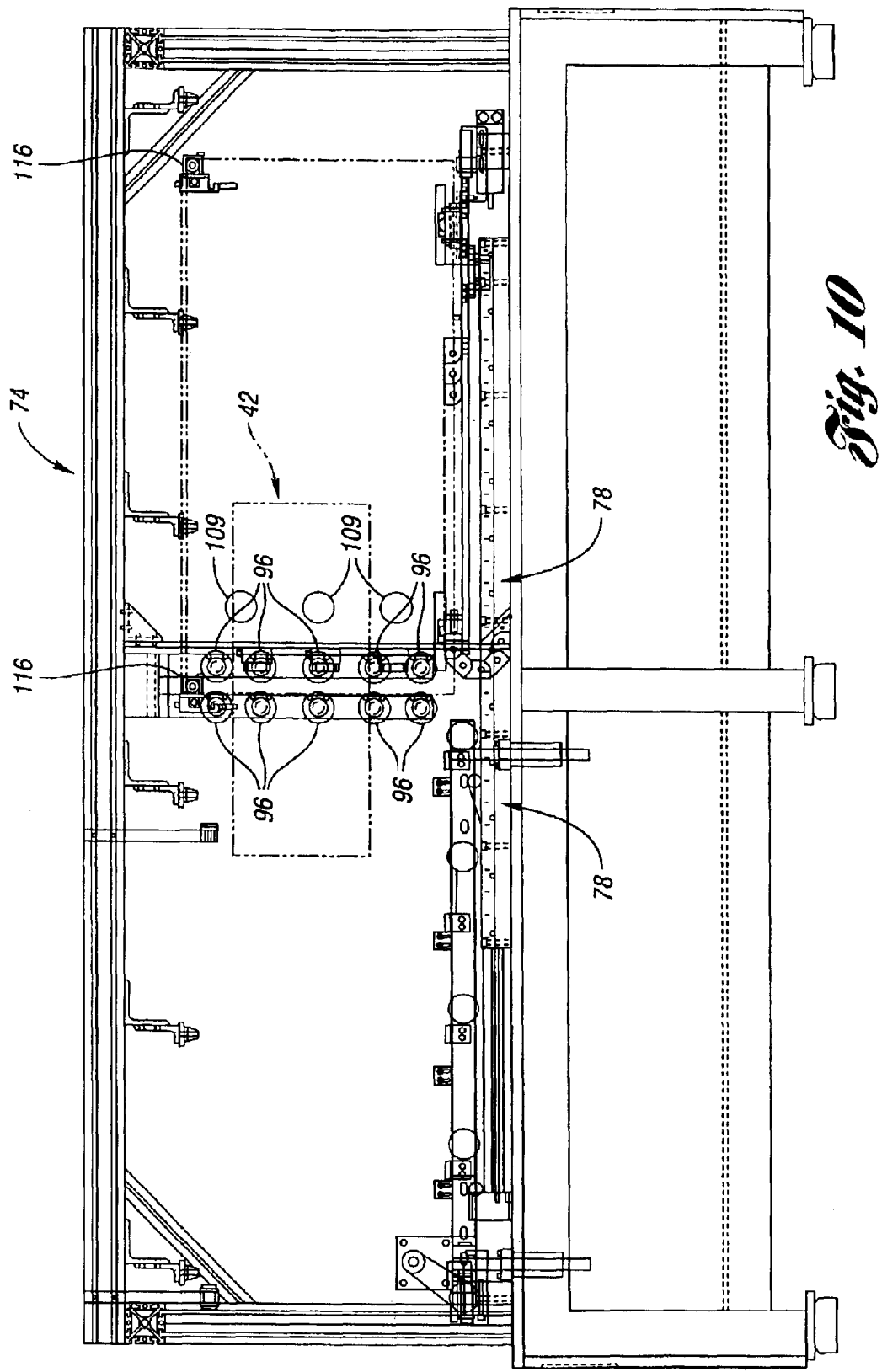
FIG. 10 is a side elevational view taken along the direction of line 10—10 in FIG. 9 to illustrate the laser scribing module at an enlarged scale from that shown in FIG. 8.

With continuing reference to FIG. 6 and additional reference to FIG. 10, the laser scribing apparatus 42 includes gas pressure and vacuum positioners 96 that maintain the glass sheet substrate planar at its uncoated surface 81 and position the substrate laterally with respect to the direction of conveyance so the focused pulsed laser beam has its focus in the Z direction at the layer or layers being scribed. These positioners 96 are located in vertically extending sets both upstream and downstream of the location where the laser beam 84 passes through the glass sheet substrate to provide the laser scribing. More specifically as illustrated in FIG. 10, there are five of the positioners 96 upstream of the scribing location and five of the positioners downstream of the scribing location. As illustrated in FIGS. 6 and 7, each of the positioners 96 has a central location 98 to which a vacuum is applied from a vacuum source 100 through an associated conduit 102. An annular porous member 104 of each positioners 96 extends around the central location 98 and receives pressurized gas from a gas source 106 through an associated conduit 108. The positioners 96 position the uncoated glass sheet surface 81 within about 4–6 microns so as to provide an accurate location for the laser beam focusing and the ablations at the layer or layers being scribed.

Figure 8:
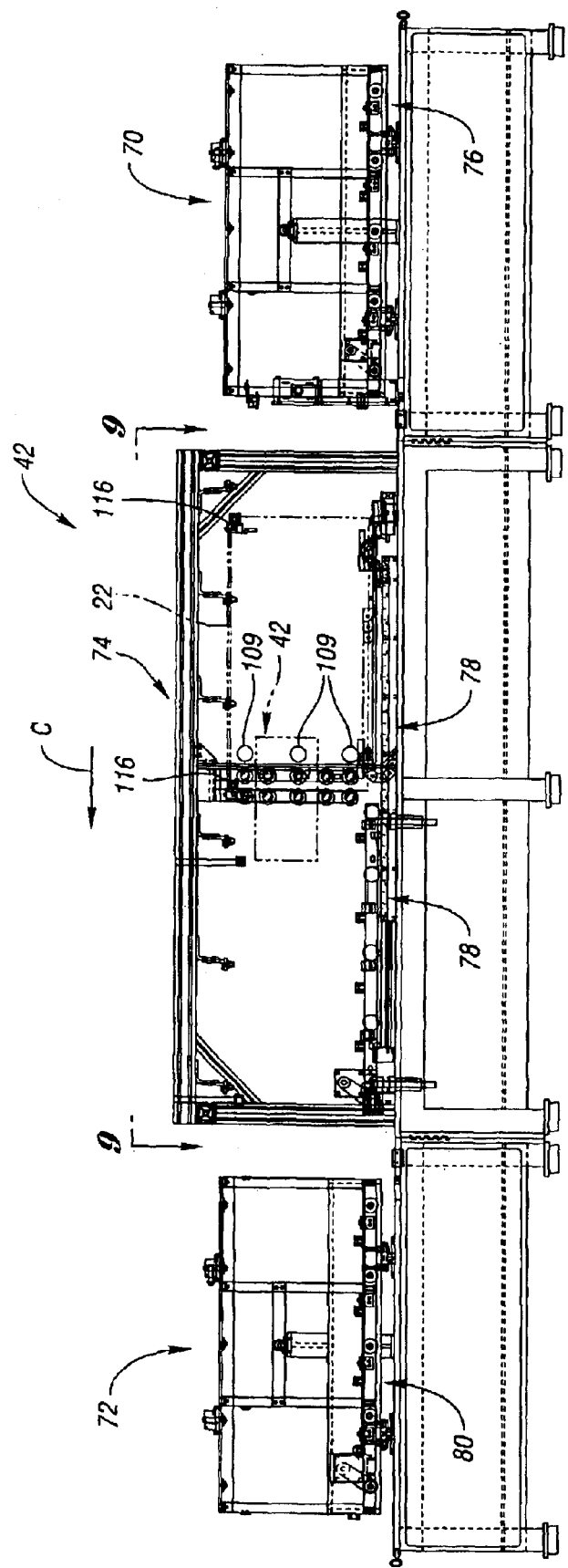
FIG. 8 is a side elevational view illustrating the laser scribing stations, each of which has a right loading end, a center laser scribing module, and a left unloading end.

As shown in FIGS. 6, 8 and 10, laser detectors 109 located upstream from the scribing location provide laser detection beams $109_a$ (FIG. 6) that are reflected back from the uncoated glass surface 81 to detect the exact position of the glass substrate and through connection to the focuser of the galvanometer mirror system 90 focuses the pulsed scribing laser beam 84 in response to the position detected throughout the range of movement and scribing of the scribing laser beam. This detection accommodates for any nonplanarity of the glass sheet substrate such as roller waves formed when the glass is manufactured.

Figure 12:
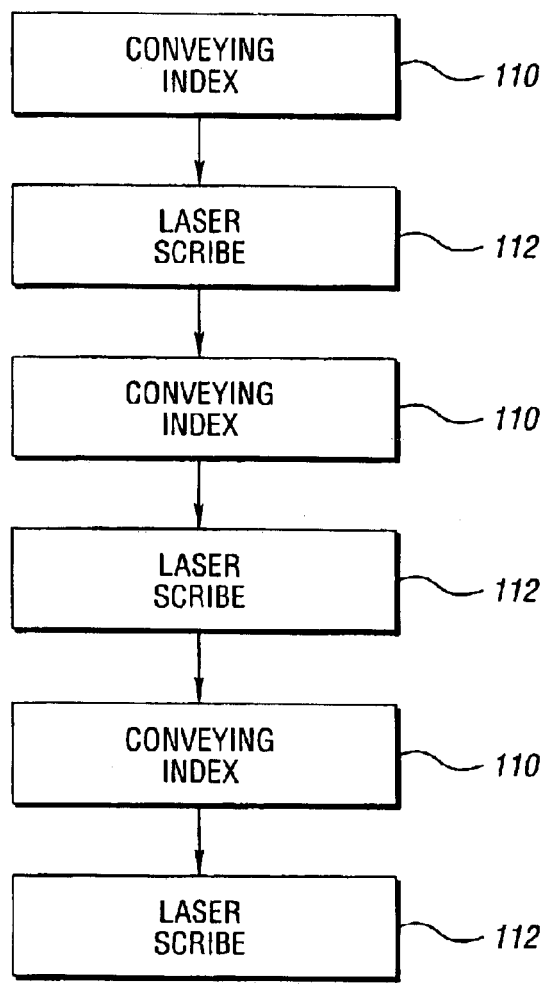
FIG. 12 is a view illustrating one way in which the laser scribing proceeds by conveying indexes with the laser scribing performed as the coated glass sheet substrate is held stationary.
Figure 13:
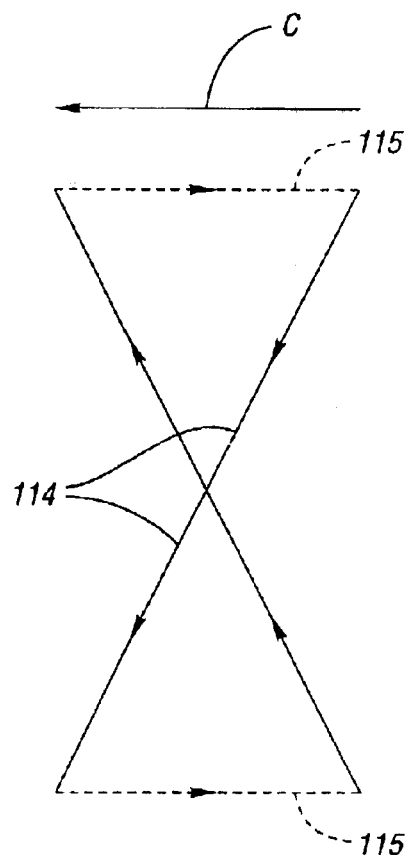
FIG. 13 is a view of another way in which the laser scribing proceeds by continuously moving the coated glass sheet substrate and moving the laser beam angularly along the direction of conveyance.

Two different ways in which the laser scribing can be performed are respectively illustrated in FIGS. 12 and 13. In FIG. 12, the laser scribing station conveyor provides a conveying index 110 between each laser scribe 112 during which the coated substrate is held stationary such that the laser beam moves vertically to perform the scribing, after first having been adjusted horizontally to provide the proper spacing between the previously formed adjacent scribe. As illustrated in FIG. 13, it is also possible for the coated glass sheet substrate to be continuously conveyed along the direction of conveyance C and the path of the laser scribes 114 is then angular both along the direction of conveyance and with respect to a true vertical direction, and after the completion of each scribe, there is a reset motion 115 of the galvanometer controlled mirror system such that the complete pass as illustrated has a generally bow tie configuration.

With reference to FIG. 10, prior to conveyance to the first scribing station, the two upper corners of the coated glass sheet substrate are laser marked with respective fiducials which are detected by a pair of cameras 116 so as to provide a signal for accurate location of the panel and the spacing between the fiducials so that the scribing can be accurately located. This allows adjustment as necessary for thermal expansion or contraction and for different spacings between the fiducials on different substrates.

In addition, each substrate can be provided with a bar code that is sensed by a bar code reader 118 shown in FIG. 9 so as to provide identification of each particular substrate being scribed. In addition, the apparatus includes an exhaust hood 120 that receives the exhaust from the coated side of the substrate being scribed. To insure that the scribing is performed at the proper power level, the galvanometer controlled mirror 90 can periodically reflect the laser beam as shown at $84_a$ to a power meter 122 whose sensed power can then be utilized to provide any necessary adjustment of the power level from the pulsed laser source 83.

In order to provide the first, second and third sets of scribes 44, 52 and 62 through the different layers as described above, the average power levels of the lasers are respectively about 20 watts, 8 to 9 watts, and 4 to 5 watts.

While the best mode for carrying out the invention has been described in detail, those familiar with the art to which this invention relates will recognize various alternatives for practicing the invention as defined by the following claims.

What is claimed is:

1. An apparatus for laser scribing comprising:
    a laser source; and
    a system configured to direct a laser beam generated by the laser source toward an uncoated surface of a glass sheet substrate for passage therethrough to a coating on another surface to scribe a portion of the coating.
2. The apparatus of claim 1 further comprising:
    a conveyor for conveying the glass sheet substrate along a direction of conveyance along which the laser beam source is positioned.

3. The apparatus of claim 1 wherein the laser beam has a near infrared wavelength.

4. The apparatus of claim 1 wherein the laser beam source is a pulsed laser.

5. The apparatus of claim 4 wherein the pulsed laser beam has a pulse frequency in the range of 50 to 100 kilohertz.

6. The apparatus of claim 4 wherein the laser beam has a pulse duration of no greater than 70 nanoseconds.

7. The apparatus of claim 4 wherein the laser beam has a pulse duration of between 8 and 70 nanoseconds.

8. The apparatus of claim 1 wherein the system for directing the laser beam includes an XYZ galvanometer controlled mirror system.

9. The apparatus of claim 2 further comprising a gas pressure and vacuum positioner located along the direction of conveyance adjacent to the location at which the laser beam passes through the substrate.

10. The apparatus of claim 9 further comprising a laser detector adjacent to the positioner.

11. An apparatus for laser scribing comprising:
a plurality of pulsed laser sources for scribing at different power levels; and
a plurality of directing systems for directing the laser beams through an uncoated side of a substrate for scribing a coated side of the substrate at different layers.

12. The apparatus of claim 11 wherein at least one directing system is an XYZ galvanometer controlled mirror system.

13. The apparatus of claim 11 wherein at least one laser source has a pulse frequency in the range of 50 to 100 kilohertz and a pulse duration no greater than 70 nanoseconds.

14. The apparatus of claim 11 further comprising a conveyor for conveying a glass sheet substrate along a direction of conveyance along which the laser sources and directing systems are positioned, with the substrate having oppositely facing surfaces one of which is uncoated and the other of which has a coating.

15. The apparatus of claim 14 further comprising a laser source positioned along the direction of conveyance to provide a laser beam capable of scribing the coated surface of the substrate at speeds of at least about 1000 millimeters per second.

16. The apparatus of claim 13 wherein the laser beam has a near infrared wavelength.

17. The apparatus of claim 15 wherein the laser beam has a pulse frequency in the range of 50 to 100 kilohertz.

18. The apparatus of claim 15 wherein the laser beam has a pulse duration of no greater than 70 nanoseconds.

19. The apparatus of claim 15 wherein the laser beam has a pulse duration of between 8 and 70 nanoseconds.

20. The apparatus of claim 15 wherein at least one directing system is an XYZ galvanometer controlled mirror system.

21. The apparatus of claim 15 further comprising a gas pressure and vacuum positioner along the direction of conveyance adjacent to the location at which the pulsed laser beam contacts the substrate.

22. The apparatus of claim 21 further comprising a laser detector adjacent to the positioner.

23. The apparatus of claim 1 wherein the laser source is a vanadate laser source.

24. A method for laser scribing comprising conveying a glass sheet substrate having an uncoated surface and a coated surface opposite the uncoated surface along a direction of conveyance adjacent a laser source that provides a laser beam, and directing the laser beam toward the uncoated surface of the glass sheet substrate through the uncoated surface, and to the coating on the other side of the substrate.

25. The method of claim 24 wherein directing the laser beam includes creating overlapping ablations in the coating.

26. The method of claim 24 wherein the laser beam has a near infrared wavelength.

27. The method of claim 24 wherein the laser beam is a pulsed laser beam.

28. The method of claim 27 wherein the pulsed laser beam has a pulse frequency in the range of 50 to 100 kilohertz.

29. The method of claim 28 wherein the pulse from the laser has a duration of no greater than 70 nanoseconds.

30. The method of claim 29 wherein a pulse from the laser has a duration of from 8 to 70 nanometers.

31. The method of claim 24 wherein directing the laser beam comprises reflecting the laser beam from the laser source using an XYZ galvanometer controlled mirror system.

32. The method of claim 24 further comprising conveying the glass sheet substrate in a vertical orientation, and controlling the planarity of the substrate and positioning the substrate laterally with respect to the direction of conveyance using a gas pressure and vacuum positioner located adjacent to the location at which the pulsed laser beam passes through the substrate.

33. The method of claim 32 further comprising positioning the glass sheet substrate using a gas pressure and vacuum positioner acting on the uncoated surface of the glass sheet substrate so there is no degradation of the coated surface.

34. The method of claim 33 further comprising detecting the position of the glass sheet substrate using a laser detection beam adjacent to the positioner.

35. The method of claim 34 further comprising focusing the pulsed laser beam in response to the position detected.

36. The method of claim 24 wherein conveying the glass sheet substrate provides indexing thereof.

37. The method of claim 24 wherein the substrate is held stationary during the laser scribing.

38. The method of claim 24 wherein the laser scribing is performed as the glass sheet substrate is conveyed.

39. The method of claim 24 further comprising providing a glass sheet substrate with a plurality of different coated layers, and scribing through different layers on the substrate using a plurality of laser scribes at different power levels.

40. The method of claim 39 further comprising scribing the substrate using a plurality of pulsed laser sources at different power levels and associated XYZ galvanometer controlled mirrors wherein each pulsed laser source includes pulse frequencies in the range of 50 to 100 kilohertz, and pulse durations no greater than 70 nanoseconds.

* * * * *